United States Patent
Feygin et al.

(10) Patent No.: US 6,212,664 B1
(45) Date of Patent: Apr. 3, 2001

(54) METHOD AND SYSTEM FOR ESTIMATING AN INPUT DATA SEQUENCE BASED ON AN OUTPUT DATA SEQUENCE AND HARD DISK DRIVE INCORPORATING SAME

(75) Inventors: Gennady Feygin, Dallas; Robert B. Staszewski, Garland; Michel Combes, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/060,918

(22) Filed: Apr. 15, 1998

(51) Int. Cl.$^7$ .................................................. H03M 13/03
(52) U.S. Cl. .......................... 714/796; 714/795; 714/794
(58) Field of Search ..................... 714/795, 6, 7, 714/794, 796; 375/341, 295; 360/46, 65, 51; 708/3, 300

(56) References Cited

U.S. PATENT DOCUMENTS

| | | | |
|---|---|---|---|
| 4,606,027 | 8/1986 | Otani | 714/795 |
| 4,644,564 | 2/1987 | Dolivo et al. | 375/295 |
| 4,757,506 | 7/1988 | Heichler | 714/795 |
| 4,777,636 | 10/1988 | Yamashita et al. | 714/795 |
| 5,327,440 | 7/1994 | Fredrickson et al. | 714/795 |
| 5,341,249 | 8/1994 | Abbott et al. | 360/46 |
| 5,377,133 * | 12/1994 | Riggle et al. | 708/524 |
| 5,379,306 | 1/1995 | Noma et al. | 714/792 |
| 5,521,945 * | 5/1996 | Knudson | 375/341 |
| 5,585,975 | 12/1996 | Bliss | 360/65 |
| 5,588,011 | 12/1996 | Riggle | 714/792 |
| 5,619,539 | 4/1997 | Coker et al. | 375/341 |
| 5,689,532 | 11/1997 | Fitzpatrick | 375/341 |
| 5,696,639 | 12/1997 | Spurbeck et al. | 360/51 |
| 5,970,097 * | 10/1999 | Ishikawa et al. | 375/262 |
| 5,982,822 * | 11/1999 | Hatakeyama | 714/795 |
| 5,995,562 * | 11/1999 | Koizumi | 375/341 |
| 6,009,128 * | 12/1999 | Mobin et al. | 375/341 |
| 6,016,330 * | 1/2000 | Ashley et al. | 375/341 |
| 6,029,267 * | 2/2000 | Simanapalli et al. | 714/795 |
| 6,037,886 * | 3/2000 | Staszewski et al. | 341/139 |

OTHER PUBLICATIONS

Knudson, et al., (Dynamic Threshold Implementation of the Maximum–Likelihood Detector for the EPR4 Channel, IEEE, Dec. 1991).*

Fettweis, et al. (Parallel Viterbi Decoding by Breaking the Compare–Select Feedback Bottleneck, IEEE, 1988).*

Shafiee, et al., (A Reduced–Complexity Trellis Search Decoding Algorithm for Extended Class IV Partial Response Systems. IEEE, 1992).*

Fukahory, et al., (SP 24.2: An Analog EPR4 Viterbi Detector in Read Channel IC for Magnetic Hard Disks. IEEE, 1998).*

(List continued on next page.)

Primary Examiner—Albert Decady
Assistant Examiner—Guy Lamarre
(74) Attorney, Agent, or Firm—W. Daniel Swayze, Jr.; Wade James Brady III; Frederick J. Telecky, Jr.

(57) ABSTRACT

A method for generating an updated path metric includes combining each of first and second provisional path metric first portions with an associated branch metric first portion to produce a first provisional updated path metric first portion candidate and a second provisional updated path metric first portion candidate, respectively. The method also includes selecting one of the provisional first portion updated path metric candidates to produce an updated path metric first portion candidate and combining any carry component of the selected updated path metric first portion candidate with a path metric second portion and a branch metric second portion to produce a first updated path metric second portion candidate. The method also includes comparing the updated path metric second portion candidate to at least one other updated path metric second portion candidate; and selecting one of the updated path metric second portion candidates to produce an updated path metric second portion.

20 Claims, 6 Drawing Sheets

OTHER PUBLICATIONS

Forney, G. David, Jr., "The Viterbi Algorithm," *Proceedings of the IEEE*, vol. 61, No. 3, pp. 268–278, Mar. 1973.

Orndorff, R.M., J.D. Krcmarik, R.J. Colesworthy, T.W. Doak, and Dr. R. Koralek, "Viterbi Decoder VLSI Integrated Circuit for Bit Error Correction," National Telecommunications Conference, New Orleans, Louisiana, Dec. 1981.

Hoppes, Philip E.C., and Ronald D. McCallister, "A Monolithic CMOS Maximum–Likelihood Convolutional Decoder for Digital Communications System," IEEE International Solid–State Circuits Conference, p. 28–29, Feb. 10, 1982.

Pollara, Fabrizio, "Concurrent Viterbi Algorithm with Trace–Back," *SPIE*, 1986.

Provence, John D., "Systolic Array Implementation for an Adaptive Viterbi Receiver," *IEEE*, pp. 1021–1027, 1987.

Grami, Ali, Dimitrios Makrakis, and Subbarayan Pasupathy, "Detection Using a Noise, Estimation–Cancellation Technique," *IEEE Transactions on Communications*, vol. COM–35, No. 8, pp. 786–792, Aug. 1987.

Ishii, et al. (Tap Selectable Viterbi Equalization in Spatial and Temporal Domains for Multipath Channel. IEEE, 1995).*

Kubo, et al. (A Suboptimal Sequence Estimation Scheme Employing a Survivor–Correction Viterbi Algorithm. IEEE, 1997).*

Knudson–Fitzpatrick, (A Reduced Complexity EPR4 Post–Processor, IEEE, 1998.*

Provence, John D., "Neural Network Implementation for an Adaptive Maximum–Likelihood Receiver," *IEEE*, pp. 2381–2385, 1988.

Dolinar, S., "A New Code for Galileo," *TDA Progress Report*, No. 42–93, pp. 83–96, Jan.–Mar. 1988.

Lahmeyer, C.R., and K.–M. Cheung, "Long Decoding Runs for Galileo's Convolutional Codes," *TDA Progress Report*, No. 42–95, p. 143. Jul.–Sep., 1988.

Statman, J., G. Zimmerman, F. Pollara, and O. Collins, "A Long Constraint Length VLSI Viterbi Decoder for the DSN," *TDA Progress Report*, No. 42–95, pp. 134–142, Jul.–Sep. 1988.

Collins, O., F. Pollara, S. Dolinar, and J. Statman, "Wiring Viterbi Decoders (Splitting deBruijn Graphs)," *TDA Progress Report*, No. 42–96, pp. 93–103, Oct.–Dec. 1988.

Lin, Horng–Dar, and David G. Messerschmitt, "Improving the Iteration Bound of Finite State Machines," *IEEE*, pp. 1328–1331, 1989.

Parhi, Keshab K., "Look–Ahead in Dynamic Programming and Quantizer Loops," *IEEE*, pp. 1382–1387, 1989.

Zou, G., and H. Weinrichter, "Straightforward Design of Trellis Coded Modulation with New Lower Bound on Free Euclidean Distance," *Electronics Letters*, vol. 25, No. 6, pp. 406–407, Mar. 16, 1989.

McEliece, Robert J., and Ivan M. Onyszchuk, "Truncation Effects in Viterbi Decoding," *Milcom '89*, Boston, Error–Control Coding Session, pp. 1–9, Oct. 1989.

Hekstra, Andries P., "An Alternative to Metric Rescaling in Viterbi Decoders," *IEEE Transactions on Communications*, vol. 37, No. 11, pp. 1220–1222, Nov. 1989.

Goodes, Grant, Ahmad Sayes, and Satwant Signh,"Av=4, Three–Processor Viterbi Decoder," *EE 1823S, Final Report*, Jul. 10, 1990.

Knudson, Kelly J., Jack K. Wolf, and Laurence B. Milstein, "Dynamic Threshold Implementation of the Maximum–Likelihood Detector for the EPR4 Channel," *IEEE*, pp. 2135–2139, 1991.

Sparsø, Jens, Henrik N. Jørgensen, Erik Paaske, Steen Pedersen, and Thomas Rübner–Petersen, "An Area–Efficient Topology for VLSI Implementation of Viterbi Decoders and Other Shuffle–Exchange Type Structures," *IEEE Journal of Solid–State Circuits*, vol. 26, No. 2, pp. 90–97, Feb. 1991.

Onyszchuk, I.M., "Testing Interconnected VLSI Circuits in the Big Viterbi Decoder," *TDA Progress Report*, No. 42–106, pp. 175–182, Aug. 15, 1991.

Collins, Oliver M., "The Subtleties and Intricacies of Building a Constraint Length 15 Convolutional Decoder," *IEEE Transactions of Communications*, vol. 40, No. 12, pp. 1810–1819, Dec. 1992.

Eshraghi, Aria, Terri S. Fiez, Kel D. Winters, and Thomas R. Fischer, "Design of a New Squaring Function for the Viterbi Algorithm," *IEEE Journal of Solid–State Circuits*, vol. 29, No. 9, pp. 1102–1107, Sep. 1994.

Orndorff, Kremarik, Colesworthy, Doak, Koralek, "Viterbi Decoder VLSI Integrated Circuit for Bit Error Correction," National Telecommunications Conference, New Orleans, Louisiana, Rockwell International, pp. 1–4, Dec. 1981.

Hoppes and McCallister, "A Monolithic CMOS Maximum–Likelihood Convolutional Decoder for Digital Communications Systems," IEEE International Solid–State Circuits Conference, pp. 28 & 29, Feb. 10, 1982.

* cited by examiner

METHOD AND SYSTEM FOR ESTIMATING AN INPUT DATA SEQUENCE BASED ON AN OUTPUT DATA SEQUENCE AND HARD DISK DRIVE INCORPORATING SAME

TECHNICAL FIELD OF THE INVENTION

This invention relates generally to sequence detection and more particularly to maximum likelihood sequence estimation and the use of same in a hard disk drive.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space. An axiom in the computer industry is that there is no such thing as enough memory and disk storage space.

To meet these ever increasing demands, hard disk drives continue to evolve and advance. Some of the early disk drives had a maximum storage capacity of five megabytes and used fourteen inch platters, whereas today's hard disk drives are commonly over one gigabyte and use 3.5 inch platters. Correspondingly, advances in the amount of data stored per unit of area, or areal density, have dramatically accelerated. For example, in the 1980's, areal density increased about thirty percent per year while in the 1990's annual areal density increases have been around sixty percent. The cost per megabyte of a hard disk drive is inversely related to its areal density.

Mass storage device manufacturers strive to produce high speed hard disk drives with large data capacities at lower and lower costs. A high speed hard disk drive is one that can store and retrieve data at a fast rate. One aspect of increasing disk drive speed and capacity is to improve or increase the areal density. Areal density may be increased by improving the method of storing and retrieving data.

In general, mass storage devices and systems, such as hard disk drives, include a magnetic storage media, such as rotating disks or platters, a spindle motor, read/write heads, an actuator, a pre-amplifier, a read channel, a write channel, a servo controller or digital signal processor, and control circuitry to control the operation of the hard disk drive and to properly interface the hard disk drive to a host or system bus. The read channel, write channel, servo controller, and a memory may all be implemented as one integrated circuit that is referred to as a data channel. The control circuitry often includes a microprocessor for executing control programs or instructions during the operation of the hard disk drive.

A hard disk drive performs write and read operations when storing and retrieving data. A typical hard disk drive performs a write operation by transferring data from a host interface to its control circuitry. The control circuitry then stores the data in a local dynamic random access memory. A control circuitry processor schedules a series of events to allow the information to be transferred to the disk platters through a write channel. The control circuitry moves the read/write heads to the appropriate track and locates the appropriate sector of the track. Finally, the hard disk drive control circuitry transfers the data from the dynamic random access memory to the located sector of the disk platter through the write channel. A sector generally has a fixed data storage allocation, typically 512 bytes of user data. A write clock controls the timing of a write operation in the write channel. The write channel may encode the data so that the data can be more reliably retrieved later.

In a read operation, the appropriate sector to be read is located by properly positioning the read head and data that has been previously written to the disk is read. The read/write head senses the changes in the magnetic flux of the disk platter and generates a corresponding analog read signal. The read channel receives the analog read signal, conditions the signal, and detects "zeros" and "ones" from the signal. The read channel conditions the signal by amplifying the signal to an appropriate level using automatic gain control (AGC) techniques. The read channel then filters the signal, to eliminate unwanted high frequency noise, equalizes the channel, detects "zeros" and "ones" from the signal, and formats the binary data for the control circuitry. The binary or digital data is then transferred from the read channel and is stored in the DRAM of the control circuitry. The processor then communicates to the host that data is ready to be transferred. A read clock controls the timing of a read operation in the read channel.

As the disk platters are moving, the read/write heads must align or stay on a particular track. This is accomplished by reading auxiliary information from the disk called a servo wedge. The servo wedge indicates the position of the heads both in a radial direction and along the circumference of a track. The data channel receives this position information so the servo controller can continue to properly position the heads on the track.

Traditional hard disk drive data or read channels used a technique known as peak detection for extracting or detecting digital information from the analog information stored on the magnetic media. In this technique, the waveform is level detected and if the waveform level is above a threshold during a sampling window, the data is considered a "one." More recently, advanced techniques utilizing discrete time signal processing to reconstruct the original data written to the disk are being used in read channel electronics to improve areal density. In these techniques, the data is synchronously sampled using a data recovery clock. The sample is then processed through a series of mathematical operations using signal processing theory.

There are several types of synchronously sampled data channels. Partial response, maximum likelihood (PRML); extended PRML (EPRML); enhanced, extended PRML (EEPRML); fixed delay tree search (FDTS); and decision feedback equalization (DFE) are several examples of different types of synchronously sampled data channels using discrete time signal processing techniques. The maximum likelihood detection performed in many of these systems is usually performed by a Viterbi decoder implementing the Viterbi algorithm, named after Andrew Viterbi who developed it in 1967.

The synchronously sampled data channel or read channel generally requires mixed-mode circuitry for performing a read operation. The circuitry may perform such functions as analog signal amplification, automatic gain control (AGC), continuous time filtering, signal sampling, discrete time signal processing manipulation, timing recovery, signal detection, and formatting. In all synchronously sampled data channels, the major goal during a read operation is to accurately retrieve the data with the lowest bit error rate in the highest noise environment. The data channel circuitry, including both a read channel and a write channel, may be implemented on a single integrated circuit package that contains various input and output (I/O) pins.

The Viterbi detectors used in synchronously sampled data channels receive a read signal and perform maximum likelihood detection to detect "zeros" and "ones" based on the read signal. A Viterbi detector performs multiple add, compare, select, and store operations for each discrete sample provided by the read signal. Based on these operations, the Viterbi detector performs sequence decoding to provide a digital output signal indicating data written to the rotating disks.

A first generation of PRML channels was equalized to PR4 response. However, at current recording densities, frequency response of the magnetic recording channel closely resembles an extended partial response class 4 (EPR4) channel response. The discrete-time transfer function of an EPR4 channel is $1+D-D^2-D^3$, where "D"=$e^{-j\omega T}$, where "$\omega$" is a frequency variable in radians per second and "T" is the sampling time interval in seconds. An EPR4 channel has more low frequency and less high frequency content than a PR4 channel. Therefore, modeling a magnetic recording channel as an EPR4 response yields better performance at higher recording densities, since equalizing a magnetic recording channel to an EPR4 channel response results in less high frequency noise enhancement.

Detecting read data based on an EPR4 response significantly raises the computational requirements of an associated EPR4 Viterbi detector. For example, in performing an add, compare, and select procedure, an EPR4 Viterbi detector performs 16 add, 8 compare, and 8 select operations. In contrast, a PR4 Viterbi detector performs 4 add, 2 compare and 2 select operations. The increased computational requirements of an EPR4 Viterbi detector, if not compensated for, may slow read times for an associated hard disk drive, which may be unacceptable. Moreover, as aerial densities increase, more advanced frequency responses, such as EEPR4 may be utilized, which possess even greater computational requirements.

SUMMARY OF THE INVENTION

Accordingly, a need has arisen for an improved system and method for estimating an input data sequence based on an output data sequence and hard disk drive incorporating same. The present invention provides a method and system for estimating a maximum an input data sequence based on an output data sequence and hard disk drive incorporating the same that addresses shortcomings of prior systems and methods.

According to one embodiment of the invention, a method for generating an updated path metric includes combining each of first and second provisional path metric first portions with an associated branch metric first portion to produce a first provisional updated path metric first portion candidate and a second provisional updated path metric first portion candidate, respectively. The method also includes selecting one of the provisional first portion updated path metric candidates to produce an updated path metric first portion candidate, and combining any carry component of the selected updated path metric first portion candidate with a path metric second portion and a branch metric second portion to produce a first updated path metric second portion candidate. The method also includes comparing the updated path metric second portion candidate to at least one other updated path metric second portion candidate, and selecting one of the updated path metric second portion candidates to produce an updated path metric second portion.

According to another embodiment of the invention, a hard disk drive system includes a storage media system; and a read channel for reading data from the storage media system. The read channel includes a detector operable to estimate a plurality of data values written to the storage media based on a plurality of data values read from the storage media. The detector includes a branch metric generator operable to generate a branch metric for a data value read from the storage media with respect to each of a plurality of targets and an add-compare-select system. The add-compare-select system includes a plurality of add-compare-select units. Each add-compare-select unit is operable to receive a branch metric, a path metric upper portion, and first and second provisional path metric lower portions, and generate an updated path metric upper portion and first and second updated provisional path metric lower portions.

Embodiments of the invention provide numerous technical advantages. For example, in one embodiment of the invention, a Viterbi detector is provided that reduces the time required to estimate a sequence of input data based on a sequence of output data. Therefore, a hard disk drive or other apparatus may acquire and interpret a sequence of data more rapidly, which reduces latency time in a hard disk drive. In addition, a faster data transfer rate for hard disk drives or other communication channels may be achieved. A faster transfer rate produces a faster seek time, which is desirable. The increased detection speed may be attributed to performing operations on only a portion of the binary number to effect pipelining. The invention also may be used to decrease decoding time associated with Viterbi decoders.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1A through 7 of the drawings, like numerals being used for like and corresponding parts of the various drawings.

Figure 1A:
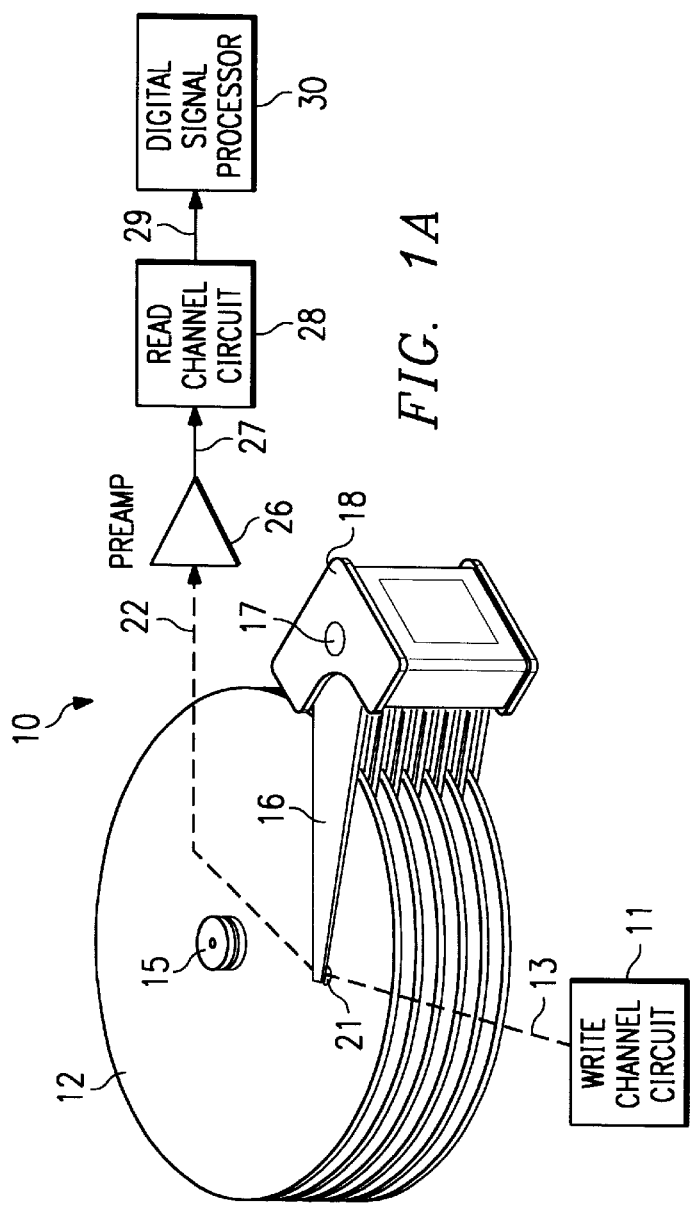
FIG. 1A is a diagrammatic view of a portion of a hard disk drive system according to the teachings of the present invention.

FIG. 1A is a diagrammatic view of a portion of a hard disk drive system according to the teachings of the present invention. Hard disk drive system 10 includes a plurality of magnetic disks 12. Magnetic disks 12 are fixedly secured to a spindle 15. Spindle 15 is rotationally driven by a spindle motor (not explicitly shown). A plurality of arms 16 are supported for pivotal movement about an axis defined by a pivot axis 17. Pivotal movement of arms 16 is controlled by a voice coil motor 18. At an outer end of each arm 16 is a read/write head 21. Head 21 includes respective portions that serve as a read head and a write head for reading from, and writing to, magnetic disks 12, respectively.

As illustrated, write channel circuit 11 provides a magnetic disk input signal 13 to magnetic disks 12. Magnetic disk input signal 13 comprises a series of binary zeros and ones. A magnetic disk output signal 22, based on the magnetic disk input signal 13, is provided from magnetic disks 12 to a preamplifier 26 by head 21. An output signal 27 of preamplifier 26 is provided to a read channel circuit 28. An output signal 29 of read channel circuit 28 is provided to a digital signal processor 30. According to one embodiment of the invention, read channel circuit 28 is a partial response maximum likelihood (PRML) circuit.

Figure 1B:
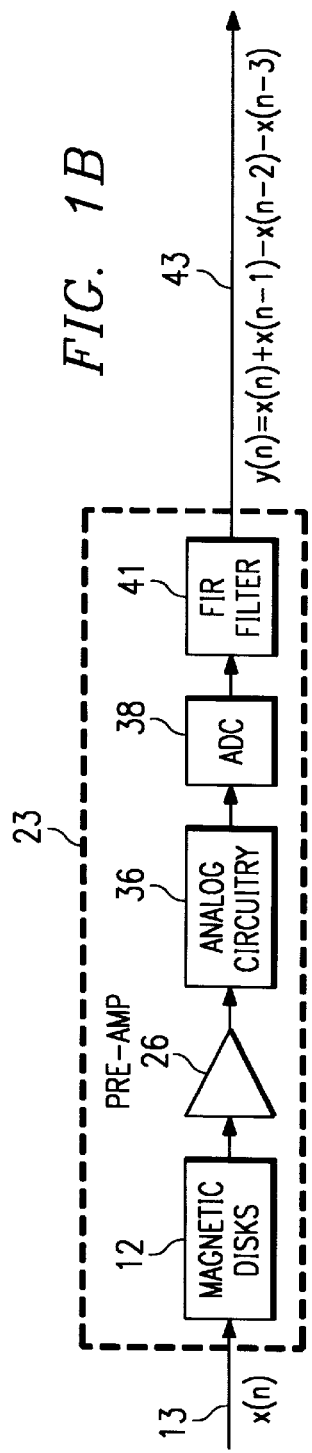
FIG. 1B is a block diagram illustrating input and output characteristics of magnetic disks in the hard disk drive system shown in FIG. 1A.

FIG. 1B is a block diagram illustrating input and output characteristics of a portion 23 of hard disk drive system 10. Portion 23 of hard disk drive system 10 includes magnetic disks 12, preamp 26, and portions of read channel circuit 28 including, analog circuitry 36, an analog-to-digital converter 38, and a frequency impulse response filter 41. These elements of portion 23 are described in greater detail below in conjunction with FIG. 2. As illustrated, according to one embodiment of the invention, the density at which data in magnetic disk input signal 13 is written to magnetic disks 12 produces a digital output signal 43 from a frequency impulse response filter 41 that is related to magnetic disk input signal 13 by the formula:

$$y(n)=x(n)+x(n-1)-x(n-2)-x(n-3),$$

where x(n)=magnetic disk input signal 13 at time n; and y(n)=magnetic disk output signal 22 corresponding to x(n).

This described relationship, which approximates the relationship between digital output signal 43 and magnetic disk input signal 13, is an EPR4 frequency response. In conjunction with other elements of read channel circuit 28, a Viterbi detector in read channel 28 determines the value of magnetic disk input signal 13 based on the received value of digital output signal 43.

Figure 2:
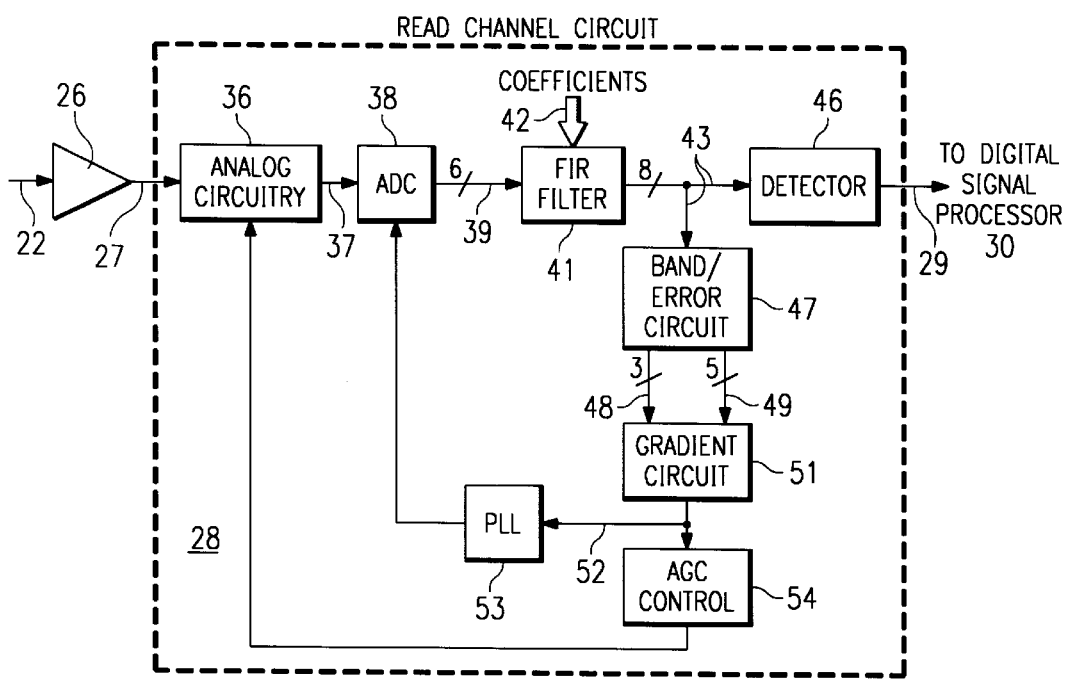
FIG. 2 is a block diagram of a read channel circuit in the hard disk drive system illustrated in FIG. 1A.

FIG. 2 is a block diagram of read channel circuit 28 of hard disk drive system 10 illustrated in FIG. 1. Read channel circuit 28 includes analog circuitry 36. Analog circuitry 36 receives output signal 27 from preamp 26. Analog circuitry 36 may include an automatic gain control circuitry (not explicitly shown) and a filter (not explicitly shown), such as a low pass filter to remove unwanted higher frequency noise from output signal 27. An analog circuitry output signal 37 is provided by analog circuitry 36 to an analog-to-digital converter circuit 38. Analog-to-digital converter 38 receives analog circuitry output signal 37 and produces a 6-bit digital output signal 39.

Digital output signal 39 of analog-to-digital converter 38 is provided to an equalizer, which may be, for example, a finite impulse response filter 41. Finite impulse response filter 41 receives one or more coefficients 42. Coefficients 42 define operational characteristics of filter 41. Filter 41 produces an 8-bit digital output signal 43, which is equalized to the desired EPR4 response. A detector 46 receives digital output signal 43 of filter 41. Detector 46 produces detector output signal 29, which as described above is an estimation of magnetic disk input signal 13. Detector output signal 29 is provided to digital signal processor 30, as described in conjunction with FIG. 1A above. Decoding or other circuitry may optionally be provided in read channel circuit 28 between detector 46 and digital signal processor 30.

Digital output signal 43 of filter 41 is also supplied to a band/error circuit 47. Band/error circuit 47 extracts band and error information from digital output signal 43. Band/error circuit 47 produces a 3-bit digital signal 48 representing a band value. Band/error circuit 47 also produces a 5-bit digital signal 49 representing an error value. Band and error values 48 and 49 are supplied to a gradient circuit 51. An output signal 52 of gradient circuit 51 is supplied to a phase locked loop 53. Phase locked loop 53 has as an output a clock signal that is coupled to an input of analog-to-digital converter 38. Phase locked loop 53 facilitates timing recovery by ensuring that analog-to-digital converter 38 samples analog circuitry output signal 37 at points in time that optimize the operation of read channel circuit 28.

Output signal 52 of gradient circuit 51 is also coupled to an automatic gain control circuit 54. The output of automatic gain control circuit 54 is provided to analog circuitry 36. Automatic gain control circuit 54 facilitates gain recovery, in particular by controlling an automatic gain control circuit located within analog circuitry 36 (not explicitly shown), so as to optimize the operation of read channel circuit 28.

According to the teachings of the present invention, detector 46 receives 8-bit digital output signal 43 and produces detector output signal 29, which represents a value written to magnetic disks 12, such as a value within magnetic disk input signal 13.

Figure 3:
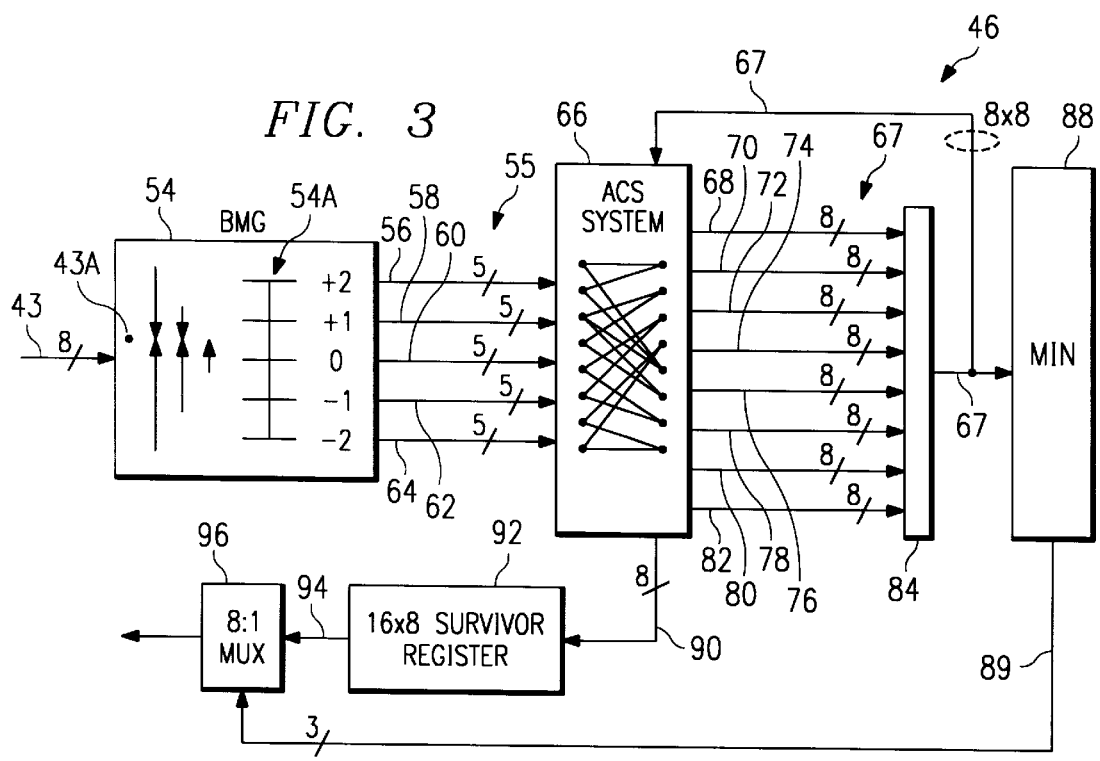
FIG. 3 is a block diagram of a detector in the read channel circuit illustrated in FIG. 2.

FIG. 3 is a block diagram of detector 46 of read channel 28 illustrated in FIG. 2. In this embodiment detector 46 is an EPR4 Viterbi detector. Detector 46 includes a branch metric generator 54, an add-compare-select system 66, a minimum path metric system 88, a survivor register system 92, and a multiplexer 96. Branch metric generator 54 receives digital output signal 43. Digital output signal 43 is an 8-bit filtered and equalized representation of magnetic disk output signal 22. A representative sample is illustrated in FIG. 3 as 43a. Comparison of sample 43a with the possible targets 54a of +2, +1, 0, −1, and −2 reveals that the sample corresponds to a value between targets of 0 and +1. As illustrated in FIG. 1B, digital output signal 43 is equal to the sum of a magnetic disk input signal 13 corresponding to an associated time period and functions of the value of magnetic disk input signal 13 at the three previous associated time periods. As described above, magnetic disk input signal 13 may have a value of binary zero or one. Therefore, digital output signal 43 may, in the absence of noise and other impairments, take on only five values corresponding to the 16 possible combinations of values for input signal 13 at a given time interval and its three previous time intervals, as illustrated in Table 1.

TABLE 1

| x(n − 3) | x(n − 2) | x(n − 1) | x(n) | y(n) |
|---|---|---|---|---|
| 0 | 0 | 0 | 0 | 0 |
| 1 | 0 | 0 | 0 | −1 |
| 0 | 1 | 0 | 0 | −1 |
| 1 | 1 | 0 | 0 | −2 |
| 0 | 0 | 1 | 0 | +1 |

TABLE 1-continued

| x(n − 3) | x(n − 2) | x(n − 1) | x(n) | y(n) |
|---|---|---|---|---|
| 1 | 0 | 1 | 0 | 0 |
| 0 | 1 | 1 | 0 | 0 |
| 1 | 1 | 1 | 0 | −1 |
| 0 | 0 | 0 | 1 | +1 |
| 1 | 0 | 0 | 1 | 0 |
| 0 | 1 | 0 | 1 | 0 |
| 1 | 1 | 0 | 1 | −1 |
| 0 | 0 | 1 | 1 | +2 |
| 1 | 0 | 1 | 1 | +1 |
| 0 | 1 | 1 | 1 | +1 |
| 1 | 1 | 1 | 1 | 0 |

As illustrated in Table 1, magnetic disk output signal 43 may, in the absence of noise, have a value of +2, +1, 0, −1, and −2. The values that magnetic disk output signal 43 may ideally take according to the above-described formula for magnetic disk output signal 22 are referred to as targets. Due to the presence of noise, values of digital output signal 43 may differ somewhat from the five possible targets.

Branch metric generator 54 receives digital output signal 43, which as described above is indicative of magnetic disk input signal 13 at a first associated time interval as well as magnetic disk input signal 13 at three previous associated time periods. Branch metric generator 54 computes a distance between a value of digital output signal 43 and each of the five specified targets: +2, +1, 0, −1, −2. The distance between a value of digital output signal 43 and each of the specified targets may be a Euclidean distance, which may be written as (output signal 43−target)², the absolute value of distance, which may be written as |output signal 43−target|, or other suitable distance measures. Such distances may be calculated according to standard techniques.

Branch metric generator 54 produces a plurality 55 of branch metrics, including a branch metric 56, 58, 60, 62, and 64 for each specified target. Each branch metric 56, 58, 60, 62, and 64 represents the negation of logarithm of the probability that digital output signal 43 represents a noise-impaired large enough to produce deviation from the value represented by the specified target. In the illustrated embodiment, branch metrics 56, 58, 60, 62, and 64 are 5-bit signals. Branch metrics 56, 58, 60, 62, and 64 are received by an add-compare-select system 66.

As described in greater detail below, add-compare-select system 66 adds each branch metric 56, 58, 60, 62, and 64 to an associated path metric to produce a potential new path metric, compares the new path metric to another potential new path metric, and selects the potential path metric with the lower value. A path metric is the sum of a number of branch metrics associated with a number of filter output signals 43 over time and is a negation of logarithm of probability that a particular sequence of values of magnetic disk input signal 13 was received by magnetic disks 12. Add-compare-select system 66 produces a plurality of path metrics 67, including path metrics 68, 70, 72, 74, 76, 78, 80 and 82. Each of the plurality of path metrics 67 is associated with a particular portion of add-compare-select system 66, as described in greater detail below in conjunction with FIGS. 4 and 5. Each of the plurality of path metrics 67 is stored in a register, such as a register in register system 84, and then fed back to add-compare-select system 66 during a next time interval. At such a next time interval, plurality 55 of branch metrics corresponding to the next time interval are added to the plurality of path metrics 67 fed back to add-compare-select system 66. Plurality of path metrics 67 is also provided to a minimum path metric unit 88.

Minimum path metric unit 88 determines which of path metrics 68, 70, 72, 74, 76, 78, 80, and 82 has the lowest value. The path metric with the lowest value indicates the path corresponding to the most likely sequence of magnetic disk input signals 13 that correspond to digital output signal 43. Minimum path metric unit 88 produces a minimum path metric output signal 89. Minimum path metric output signal 89 specifies which one of the eight path metrics 68, 70, 72, 74, 76, 78, 80, and 82 has the lowest value. Minimum path metric signal 89 is provided as a control signal of 3 bits to a multiplexer 96.

Add-compare-select system 66 also produces a decision output signal 90. Decision output signal 90 is an 8-bit number with each bit representing a decision made by an add-compare-select unit within add-compare-select system 66. Add-compare-select units are described in greater detail in conjunction with FIGS. 4 through 7. Decision output signal 90 indicates, for each add-compare-select unit in add-compare-select system, whether magnetic disk input signal 13 at an associated time period is most likely a binary zero or a binary one. Decision output signal 90 is provided to a survivor register 92.

Survivor register 92 retains, for each add-compare-select unit in add-compare-select system 66, sixteen previous calculated values for magnetic disk input signal 13. The oldest bit of each of these eight data sequences is provided over path 94 to multiplexer 96. Minimum path metric output signal 89 selects which of the eight sequences provided over path 94 to multiplexer 96 is the most likely sequence of binary zeros and binary ones for magnetic disk input signal 13. Based on this selection, multiplexer 96 provides either a binary zero or a binary one corresponding to the most likely value for magnetic disk input signal 13 at an associated time period.

According to one embodiment, survivor register 92 includes eight rows and sixteen columns of registers connected in a manner analogous to the connections within add-compare-selected system 66, described in greater detail below in conjunction with FIGS. 4 and 5. At any given clock cycle, each of the eight rows contains a sequence of the most recent sixteen zeros or ones that corresponds to an associated path metric. Generally, older values in each row will converge to the same values as older values in other rows. In such a case, the oldest bit of each data sequence provided over path 94 to multiplexer 96 will be the same, and the selection of a bit by multiplexer 96 control signal 89 is not important. If the oldest bit of each data sequence is not the same as the oldest bit in the other data sequences, control signal 89 selects the oldest bit associated with the path metric having the lowest value. Therefore, the bit corresponding to the most likely sequence of values of magnetic disk input signal 13 is selected. Additional details of add-compare-select system 66 are described in greater detail in conjunction with FIGS. 4 through 7.

Figure 4:
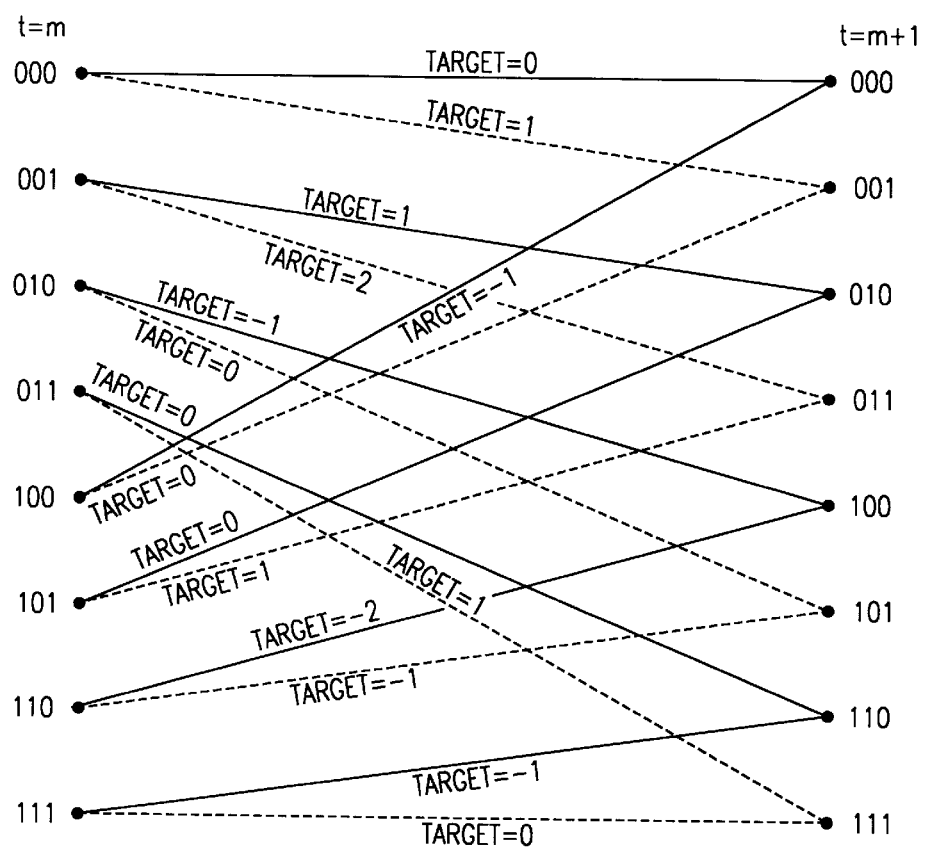
FIG. 4 is a trellis diagram showing sixteen possible transitions of the state of memory for the magnetic disks in the hard disk drive system illustrated in FIG. 1A.

FIG. 4 is a trellis diagram showing sixteen possible transitions of the state of memory of magnetic disks 12 in hard disk drive system 10 illustrated in FIG. 1. An understanding of the operation of add-compare-select units within add-compare-select system 66, described below, is facilitated with reference to FIG. 4. The lefthand side of the trellis diagram of FIG. 4 includes eight 3-bit binary numbers. For each 3 bit binary number, the left-most, or most significant, bit represents a value of magnetic disk input signal 13 three time periods before a designated time period; the center bit represents the value of input signal 13 two time periods before the designated time period; and the right-most, or least significant, bit represents the value of magnetic disk input signal 13 one time period before the designated time period. Therefore, these 3-bit numbers correspond to the state of memory of magnetic disks 12 at a designated time period, denoted in FIG. 4 as t=m.

The right-hand side of FIG. 4 corresponds to the state of memory of magnetic disks 12 at one time period after a designated period, designated as t=m+1. Therefore, the left-most, or most significant, bit of each 3-bit number on the right-hand side of FIG. 4 corresponds to the value of magnetic disk input signal 13 at two time periods before the designated time period; the center bit represents the value of magnetic disk input signal 13 at one time period before the designated time period; and the right-most, or least significant, bit of the 3-bit numbers represents the value of input signal 13 at the designated time period.

Each of the eight possible states of memory of magnetic disks 12 at a time period t=m may transition to two possible values at a time period of t=m+1. For example, the 3-bit number "000" may transition from "000" to "000," or it may transition from "000" to "001." Each transition is associated with the receipt of either of a binary zero or a binary one for the next magnetic disk input signal 13. The receipt of a binary zero is represented by the solid lines connecting the left-hand side to the right-hand side of FIG. 4, and the receipt of a binary one is represented by a dotted line from the left-hand side of FIG. 4 to the right-hand side of FIG. 4.

Each transition from the state on the left-hand side of FIG. 4 to a state on the right-hand side of FIG. 4 has an associated target. As described above, a target is the ideal value of magnetic disk output signal 43 based on a value for magnetic disk input signal 13 at a designated time and the three previous values. In this example, the value of each target is calculated by multiplying the bits corresponding to time m−3, time m−2, time m−1, and time m by −1, −1, +1, +1, respectively and adding the result. For example a transition from "100" to "001" has a target of zero calculated by: −(1)(1)−(1)(0)+(1)(0)+(1)(1)=−1+1=0. This operation corresponds to the approximate relationship between magnetic disk input signal 13 and digital output signal 43 illustrated in FIG. 1B. The connections from the state of memory of magnetic disks 12 on the left-hand side of FIG. 4 to the state of magnetic disk memory on the right-hand side of FIG. 4 specify the appropriate configuration for add-compare-select units in add-compare-select system 66, which is described with reference to FIG. 5.

Figure 5:
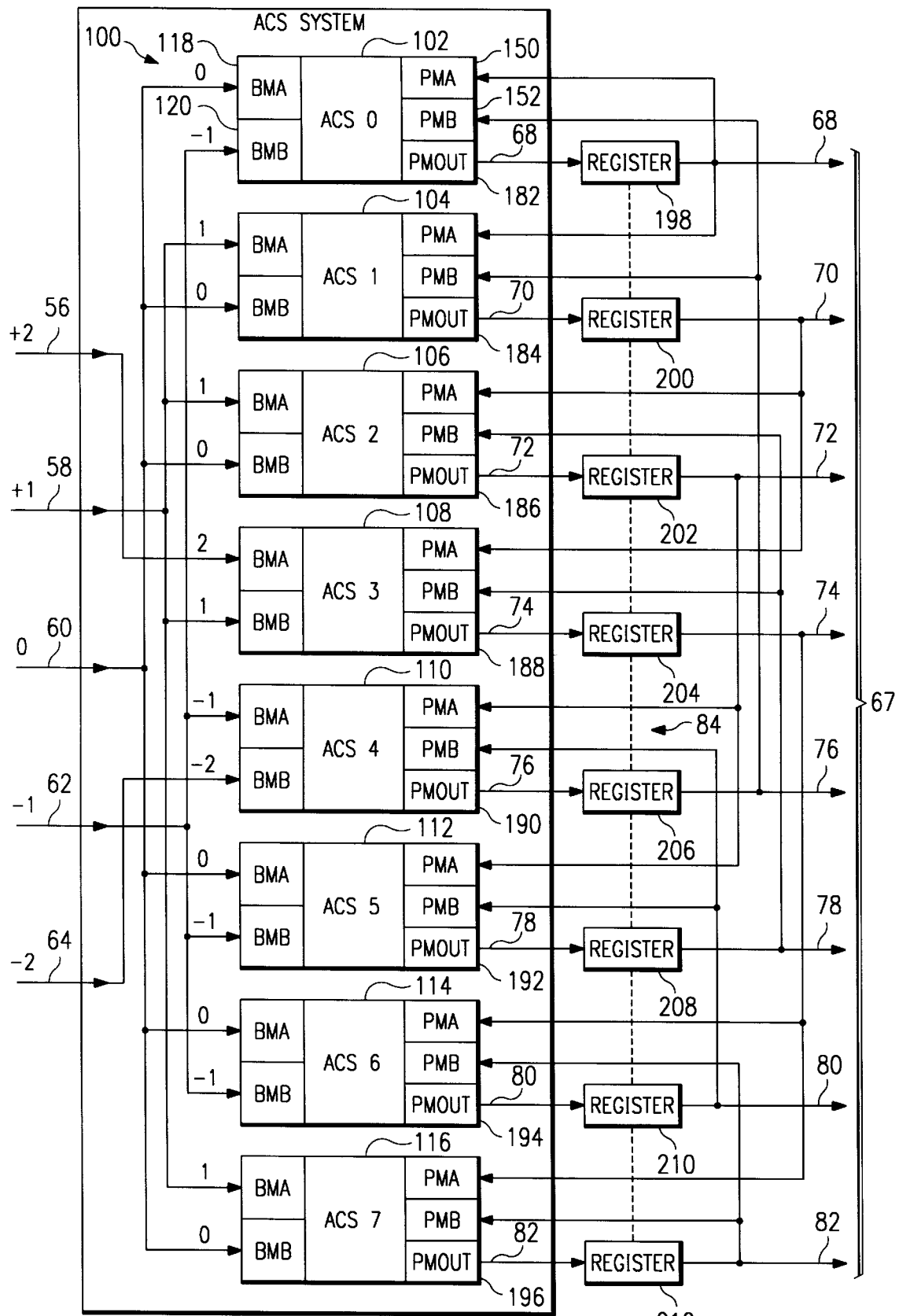
FIG. 5 is a block diagram of an add-compare-select system and a register system in the detector illustrated in FIG. 3.

FIG. 5 is a block diagram of add-compare-select system 66 and register system 84 in detector 46, illustrated in FIG. 3. Add-compare-select system 66 includes a plurality 100 of add-compare-select units, including eight add-compare-select units. Plurality 100 includes add-compare-select 0 unit 102, add-compare-select 1 unit 104, add-compare-select 2 unit 106, add-compare-select 3 unit 108, add-compare-select 4 unit 110, add-compare-select 5 unit 112, add-compare-select 6 unit 114, and add-compare-select 7 unit 116. Each of the plurality of add-compare-select units corresponds to the state of memory of magnetic disk 12 on the right-hand side of FIG. 1. For convenience, the decimal value of each 3-bit number representing the state of memory of magnetic disks 12 on the right-hand side of FIG. 4 is identified with the associated add-compare-select unit in FIG. 5. For example, add-compare-select 4 unit corresponds to the "100" state of memory of magnetic disk 12 illustrated on the right-hand side of FIG. 4. The connections of the plurality of add-compare-select units is determined with reference to FIG. 4.

As described above, add-compare-select 0 unit 102 corresponds to state "000" on the right-hand side of FIG. 4. The value of magnetic disk input signal 13 at time t=m is the right-most bit of the state of memory of magnetic disks 12 at time t=m+1. Thus, the value of magnetic disk input signal 13 at time t=m is zero. As illustrated, the previous state of memory of magnetic disks 12 at time t=m could have been either "000" or "100." If the previous state of memory of magnetic disks 12 was "000," then the calculated value for magnetic disk output signal 22, or target, is −(1) (0)−(1) (0)+(1) (0)+(1) (0)=0. Alternatively, if the previous state of memory for magnetic disks 12 was 100, the calculated value for magnetic disk output signal 22 at the next time period, or target is −(1) (1)−(1) (0)+(1) (0)+(1) (0)=−1. Therefore, add-compare-select 0 unit 102 receives branch metrics associated with targets of 0 and −1. Reception of branch metrics associated with a target of 0 is illustrated in FIG. 4 at a branch metric A input having a reference numeral of 118. The reception of a branch metric associated with a target −1 is illustrated in FIG. 5 at a branch metric B input having a reference numeral of 120. The remainder of add-compare-select units receive branch metrics associated with targets +2, +1, 0, −1, and −2 in an analogous fashion that is readily apparent from FIG. 4.

Add-compare-select 0 unit also includes a path metric A input 150 and a path metric B input 152. Path metric A input 150 receives the most recent previous value of the path metric produced by the add-compare-select units corresponding to one of the two possible states of memory of magnetic disks 12 at the most recent previous time period. Path metric B input 152 receives the most recent previous path metric value produced by the other one of two possible states of memory at the most recent previous time period. For example, path metric A input 150 receives a path metric from an add-compare-select unit corresponding to the state of memory of magnetic disks 12 from which branch metric A input 118 received a branch metric, which is state "000." Therefore, path metric A input receives a path metric from add-compare-select 0 unit 102. Path metric B input 152 receives a path metric calculated by add-compare-select 4 unit 110. Thus path metric A input 150 receives a path metric associated with the reception of a 0 for a new value of magnetic disk input signal 13 and path metric B input 152 receives a path metric associated with the reception of a 1 for a new value of magnetic disk input signal 13.

As illustrated, to delay reception of a path metric at a path metric input, path metrics produced by plurality 100 of add-compare-select units are first provided to register system 84 to effect a one time period delay before feeding back path metrics 67 to add-compare-select system 66. Register system 84 includes a plurality of registers 198, 200, 202, 204, 206, 208, 210 and 212 for receiving path metrics 68, 70, 72, 74, 76, 80, 82, and 84, respectively, and for then providing respective path metrics to appropriate path metric inputs. Therefore, registers 198, 200, 202, 204, 206, 208, 210, and 212 effect a one time period delay. Path metric outputs 68, 70, 72, 74, 76, 78, 80, and 82 are also provided to minimum path metric unit 88, illustrated in FIG. 3.

Each of the plurality 100 of add-compare-select units also includes a path metric output 182, 184, 186, 188, 190, 192, 194, and 196. Each path metric output provides a path metric to a corresponding add-compare-select unit. Path metric output 182 of add-compare-select 0 unit 102 provides path metric 68; path metric output 184 of add-compare-select 1 unit 102 provides path metric 70; path metric output 186 of add-compare-select 2 unit 106 provides path metric 72; path metric output 188 of add-compare-select 3 unit 108 provides path metric 74; path metric output 190 of add-compare-select 4 unit 110 provides path metric 76; path metric output 192 of add-compare-select 5 unit 112 provides path metric 78; path metric output 194 of add-compare-select 6 unit 114 provides path metric 80; and path metric output 196 of add-compare-select 7 unit 116 provides path metric 82. Through the illustrated connections of plurality 100 of add-compare-select units, the add-compare-select functions associated with a Viterbi detector or decoder, may be performed.

Each add-compare-select unit 100 performs two add, one compare, and one select operation to produce a path metric output. Because path metrics resulting from operations must be fed back to inputs of add-compare-select units 100 units one clock cycle later, all operations associated with all eight add-compare-select units 100 must be performed within one clock cycle. Performing add operations without pipelining further exacerbates this problem. For example, addition of plurality 55 of 5-bit branch metrics with 8-bit path metrics 67 requires sequential addition of 8-bits with associated carry operations. Therefore, addition of bit 1 of branch metrics 55 in path metrics 67 cannot occur until addition of bit 0 of branch metrics 55 and path metrics 67 occurs.

According to the invention, add and compare operations for subsequent path metric calculations are initiated before the compare and select operation is completed for a current path metric calculation. Such early initiation of add and compare operations effects pipelining, and therefore increases processing speed. Initiating subsequent additions of path metrics and branch metrics may be accomplished by retaining and carrying forward results of additions of lower portions of all path metrics and branch metrics until a selection is made after completing addition of the upper portions of path and branch metrics. An example implementation of such a method is illustrated in FIG. 6.

Figure 6:
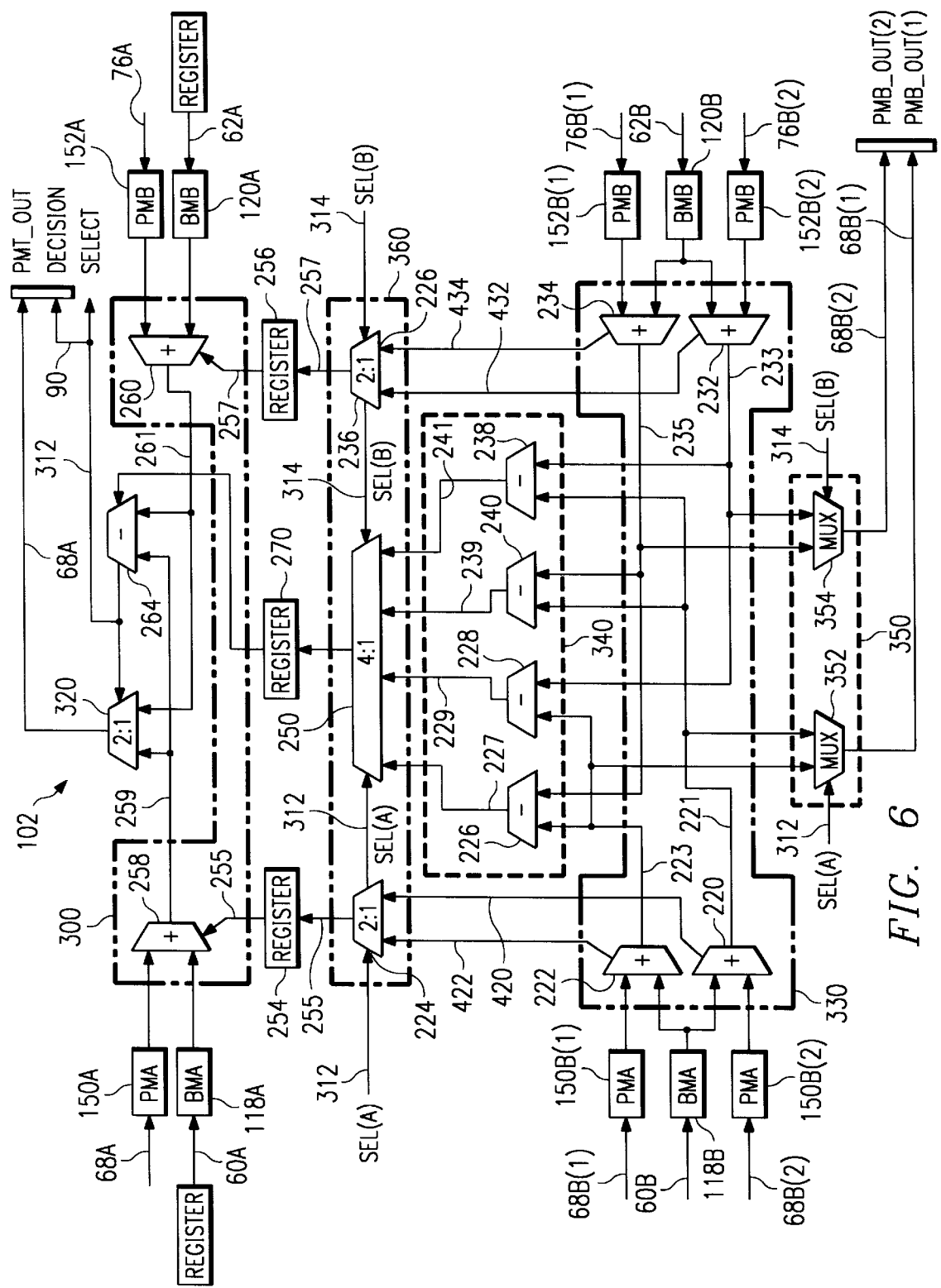
FIG. 6 is a block diagram of an example add-compare-select circuit within the add-compare-select system illustrated in FIG. 5.

FIG. 6 is a block diagram of add-compare-select unit 102 within add-compare-select system 66 illustrated in FIG. 5. Branch metric A input 118 is divided into branch metric A input 118A and branch metric A input 118B. Branch metric A input 118A receives zero or more of the more significant bits of branch metric signal 60 received by branch metric A input 118, denoted by reference numeral 60A. In one embodiment, the number of bits received by branch metric A input 118A is zero. Branch metric A input 118B receives one or more of the less significant bits, and possibly all bits, of branch metric input signal 60 received by branch metric A input 118, denoted by reference numeral 60B. In the same embodiment, the number of bits received by branch metric A input 118B is five.

Path metric A input 150 is divided into path metric inputs 150A, 150B(1), and 150B(2). Path metric A input 150A receives one or more of the more significant bits of path metric output signal 68. The more significant bits of path metric output signal 68 is designated by reference numeral 68A. In one embodiment, the number of bits received by path metric A input 150A is three. Path metric A input 150B(1) receives one or more of the less significant bits of one of two possible path metrics calculated by add-compare-select unit 102. The lesser significant bits of this possible path metric are designated by reference numeral 68B(1), which is referred to as a provisional path metric lower portion. In the same embodiment, the number of bits received by path metric A input 150B(1) is five. Path metric A input 150B(2) receives the lesser significant bits of the other one of the two possible path metrics calculated by add-compare-select unit 102. The lesser significant bits associated with this path metric are designated by reference numeral 68(B) (2), which is referred to as a provisional path metric lower portion. In the same embodiment, the number of bits received by path metric A input 150B(2) is five.

Branch metric B input 120 is divided into branch metric B input 120A and branch metric B input 120B. Branch metric B input 120A receives zero or more of the more significant bits of branch metric output signal 62. The bits of output signal 62 received by input 120A are designated by reference numeral 62A. Zero or more of the lesser significant bits of branch metric output signal 62 are provided to a branch metric input 120B. The bits of output signal 62 received by input 120B are designated by reference numeral 62B. Branch metric B inputs 120A and 120B receive the same number of bits as branch metric A inputs 118A and 118B, respectively.

Path metric B input 152 is divided into path metric B inputs 152A, 152B(1), and 152B(2). Path metric B input 152A receives one or more of the more significant bits of path metric output signal 76, which is designated by reference numeral 76A. Path metric B input 152B(1) receives one or more of the lesser significant bits of one or two possible path metric output signals calculated by add-compare-select 4 unit 110. The bits of path metric output signal 76 received by path metric B input 152B(1) are designated by reference numeral 76B(1), which is referred to as a provisional path metric lower portion. Path metric B input 152B(2) receives one or more of the lesser significant bits of the other one of the two possible path metric output signals calculated by add-compare-select 4 unit 110. The bits of path metric output signal 76 received by path metric B input 152(B) (2) are designated by reference numeral 76B(2), which is referred to as a provisional path metric lower portion. Path metric input 152C receives the less significant bits of the other path metric signal calculated by add-compare-select unit 4. Path metric B inputs 152A, 152B(1), and 152B(2) receive the same number of bits as path metric A inputs 150A, 150B(1), and 150B(2), respectively.

Add-compare-select unit 102 includes an upper bit add unit 300 and a lower bit add unit 330. Upper bit add unit 300 adds upper bits of branch metric 60 to upper bits of path metric 68 and adds upper bits of branch metric 62 to upper bits of path metric 76. Lower bit add unit 330 adds lower bits of path metric 68 to lower bits of branch metric 60 and adds lower bits of branch metric 62 to lower bits of path metric 76.

Add-compare-select unit 102 also includes an upper bit compare unit 264 and a lower bit compare unit 340. Upper bit compare unit 310 compares the results of upper bit add unit 300, and lower bit compare unit 340 compares the results of lower bit add unit 330. Add-compare-select unit 102 also includes an upper bit select unit 320. Upper bit select unit 320 selects the lesser of the values provided to upper bit compare unit 264.

Add-compare-select unit 102 also includes an output decision unit 350 and in internal selection unit 360. As described in great detail below, output decision unit 350 receives a pair of selection input signals 312 and 314 and two sets of provisional sums. Based on the selection input signals, a pair of provisional sums is provided as updated provisional lower portion path metrics. Internal decision unit 360 receives a pair of selection input signals 312 and 314, two pairs of provisional sums, and four provisional comparisons. Based on the pair of selection input signals 312 and 314, internal decision unit provides a pair of selected carry bits associated with selected sums to upper bit add unit 300 and a selected comparison to upper bit comparison unit 264.

By dividing add-compare-select unit 102 into an upper portion and a lower portion, pipelining may be effected because the results of lower bit additions are available before the results of upper bit additions. Thus lower bit additions for a next time period may occur concurrently with upper bit additions for a current time period. In order to allow this pipelining, provisional path metric lower portions are provided and are operated upon until the result of the upper bit additions and comparisons are available. When the result of upper bit additions and comparisons is available, the appropriate provisional path metric lower portion is selected and the other provisional path metric lower portion is discarded. Details of an example implementation of the above-described method are described below.

Lower bit add unit 330 includes four adders 220, 222, 232, 234. Adders 220, 222, 232, and 234 are multiple bit adders. Adder 220 receives provisional path metric lower portion 68B(2) and branch metric output signal 60B. Adder 222 receives branch metric output signal 60B and provisional path metric lower portion 68B(1). Because, according to the invention, the lower bits of path metrics and branch metrics are added prior to a selection operation, both provisional path metric lower portions 68B(1) and 68B(2) are provisionally added to lower bits of branch metric provisional path metric lower portions 68B(1) and 68B(2) output signal 60B. As described above, provisional path metric lower portions 68B(1) and 68B(2) correspond to the lower bits of the two possible path metrics calculated by add-compare-select 0 unit and are contained within path metric output signal 68. Adder 232 similarly receives provisional path metric lower portion 76(B) (1) and branch metric output signal 62B as inputs. Adder 234 receives provisional path metric lower portion 76B(2) and 76B and branch metric output signal 62B as inputs.

The sums of each adder 220, 222, 232, and 234 are provided to lower bit compare unit 340. Adder 222 produces a provisional sum 223. Adder 220 produces a provisional sum 221. Adder 232 produces a provisional sum 233. Adder 234 produces a provisional sum 235. Provisional sum 223 is compared to provisional sum 235 by comparator 226. Provisional sum 223 is compared to provisional sum 233 by comparator 228. Provisional sum 221 is compared to provisional sum 235 by comparator 240. Provisional sum 221 is compared to provisional sum 233 by comparator 238. Comparators 226, 228, 238, and 240 each provide provisional comparison output signals 227, 229, 239, and 241, respectively. Provisional comparison output signals 227, 229, 239, and 241 designate which of the two provisional sums received by each of comparators 226, 228, 238, and 240 has a lesser value. Thus a four way comparison is performed, rather than a two way comparison to compensate for performing additions of the lower bits of the path and branch metrics before a selection of the lesser path metric is made.

Provisional sums 221 and 223 are also provided to a multiplexer 224 within internal decision unit 360, and provisional sums 233 and 235 are provided to multiplexer 236 within internal decision unit 360. Multiplexer 224 receives a decision A input signal 312 and multiplexer 236 receives a decision B input signal 314. Decision A input signal 312, indicates which of the two provisional path metric lower portions 68B(1) or 68B(2) corresponds to the path metric calculated at the previous time period by an associated add-compare-select unit interval, which in this example is add-compare-select 0 unit 102. Thus multiplexer 224 provides to a register 254 a carry signal 255 indicative of any carry component of the sum of branch metric output signal 60B and either provisional path metric lower portions 68B (1) or 68B(2). The provision of a signal to register 254 indicates the end of a clock period. Decision A input signal 312 and decision B input signal 314 are provided by the add-compare-select units that provided path metric output signals to path metric A input 150 and path metric B input 152, respectively. In this example, decision A input signal 312 is provided by add-compare-select 0 unit 102, and decision B input signal 314 is provided by add-compare-select 4 unit 110. Multiplexer 236 acts in an analogous fashion to select either provisional sum 233 or sum 235 corresponding to the appropriate path metric 2 lower portion 68B(1) or 68(B)(2) and provides any carry component of a carry signal 257 result to register 256.

Select signals 312 and 314 are also provided to a multiplexer 250 to select the appropriate provisional comparison received by multiplexer 250. The appropriate provisional comparison is the provisional comparison produced by comparison of provisional sums corresponding to provisional path metric lower portions corresponding to decision signal A 312 and decision signal B 314. Multiplexer 250 provides a selected comparison 25 to a register 257. Selected comparison signal 251 indicates whether the branch metric A input 118 lower bits of the selected path metric and branch metric received at both metric A input 118 and are less than the lower bits of the selected path metric and branch metric received at path metric B input 152 and branch metric B input 120. Selected comparison 251 is used by upper bit compare unit 264, as described below.

Upper bit add unit 300 includes an adder 258 and an adder 260. Adder 258 receives as inputs, path metric output signal 68A and branch metric output signal 60A. Adder 258 also receives carry signal 255. Adder 260 receives path metric output signal 76A and branch metric output 62A as inputs. Adder 260 also receives carry signal 257. Adder 258 produces a sum 259 indicative of the sum of path metric output signal 68A and path metric output signal 60A, including any carry component received from carry signal 255. Sum 259 is provided to multiplexer 262 and comparator 264. Adder 260 produces a sum 261 indicative of the sum of path metric output signal 76A and path metric output signal 60A, including any carry component received from carry signal 257. Sum 261 is provided to multiplexer 262 2 and comparator 264. Comparator 264 also receives selected comparison signal 251 from multiplexer 250. Selected comparison signal 251 operates as a carry value to be used by comparator 264 in comparing output signals 259 and 261. If a comparison of sums 259 and 261 indicates that sums 259 and 261 are the same, selected comparison signal 251, which is based on lower bit comparisons, indicates which sum 259 or 261 to provide as an updated path metric.

The output of comparator 264 selects the smaller of sum 259 or sum 261 and provides the selected sum as an updated path metric output signal for the add-compare-select unit which in this example is 68A, which corresponds to the upper bits of an updated path metric signal 68 produced by add-compare-select unit 102. The output of comparator 264 also produces an updated select signal, which in this example corresponds to decision A input signal 312. 312 and one bit of decision signal 90. The output of comparator 264 indicates whether the sums of the path metric A and branch metric A input signals was selected as an updated path metric or whether the sums of the path metric B and branch metric B input signals was selected as an updated path metric.

The lower bits of the updated path metric output signal output signal 68B(1) and output signal 768B(2) are provided by lower bit select unit 350. Lower bit select unit 350 includes a multiplexer 352 selected by decision A input signal 312 and a multiplexer 354 selected by decision B input signal 314. Multiplexer 352 receives provisional sums 221 and 223, and multiplexer 354 receiving provisional sums 233 and 235. Multiplexer 352 produces an updated path metric lower portion 68B(1) and multiplexer 354 producing an updated path metric lower portion 68B(2). Which one of updated provisional path metric lower portions 68B(1) or 68B(2) is correct is selected one clock cycle later in time by updated select signal 312, which is generated as described above.

Thus, performance of add-compare-select system 66 and therefore hard disk drive system 10 may be enhanced due to the parallel processing of lower bits associated with a subsequent clock cycle in combination with upper bits associated with a current clock cycle.

Add-compare-select units 104, 106, 108, 110, 112, 114, and 116 are analogous to add-compare-select unit 102 with path metric inputs and outputs, select signals, and decision signals provided to and received from associated add-compare-select units as illustrated in FIGS. 4 and 5.

Figure 7:
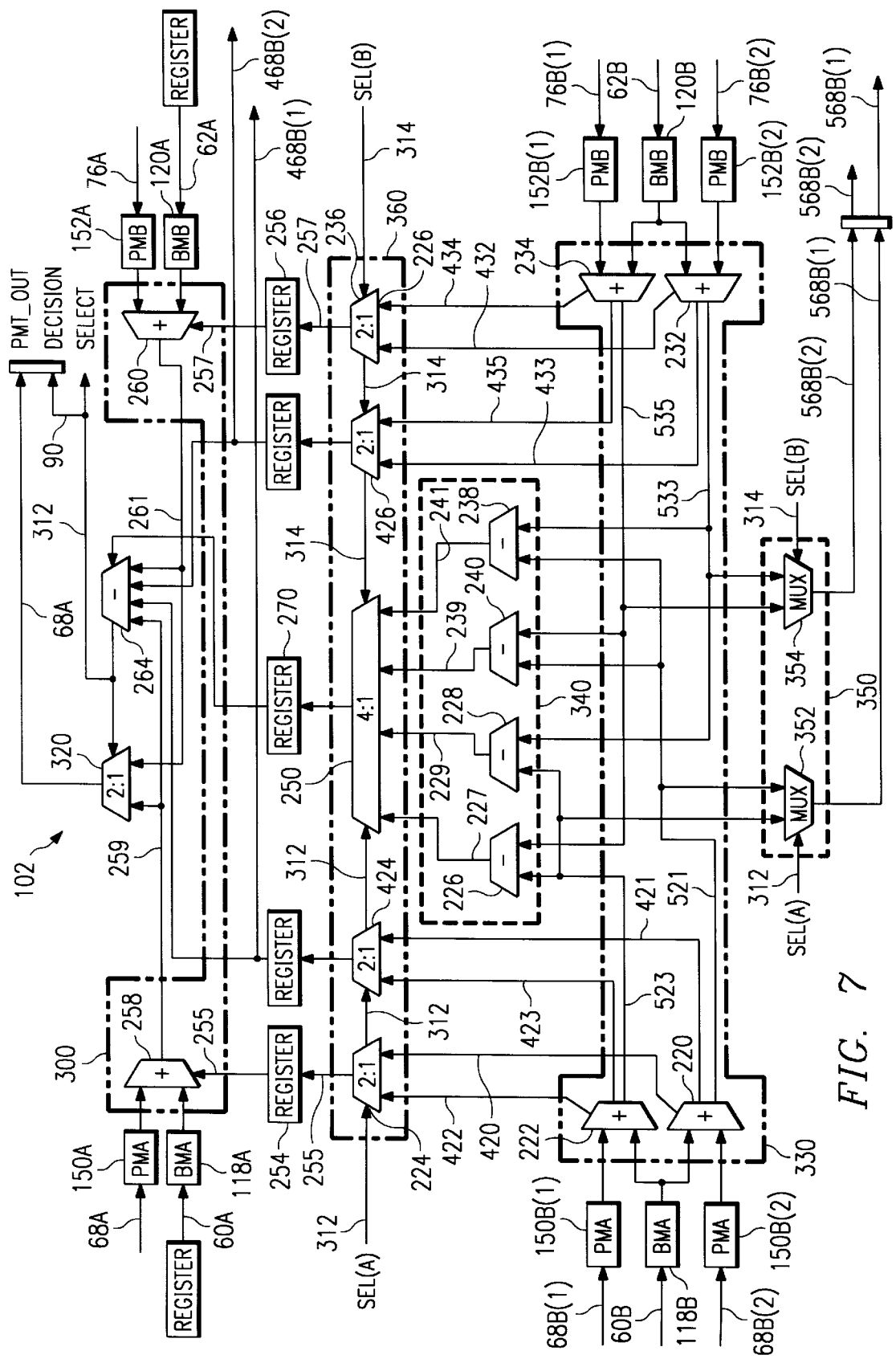
FIG. 7 is a block diagram of an alternative embodiment of the add-compare-select unit illustrated in FIG. 6.

FIG. 7 illustrates an alternative embodiment of add-compare-select unit 102. For convenience of description, analogous components of FIGS. 6 and 7 are given the same reference numerals even if the components are not identical. The following discussion is with reference to the embodiment illustrated in FIG. 7.

As illustrated in FIG. 7, add-compare-select unit 102 is analogous to the add-compare-select unit illustrated in FIG. 6, except for the addition of multiplexers 424 and 426 in internal selection unit 360. Multiplexer 424 receives sums 421 and 423 from adders 220 and 222, respectively. Sums 421 and 423 contain, in this example, the two upper bits of the two five bit sums produced by adders 220 and 222, respectively. The lower three bits of the five bit sums produced by adders 220 and 222 are provided as sums 521 and 523, respectively. Thus, the results of the lower portion additions by adders 220 and 222 are divided into two portions. The results of lower portion additions of adders 232 and 234 are similarly divided, and sums 433 and 435, representing the two upper bits of sums produced by adders 232 and 234, are provided to multiplexer 426. Multiplexers 424 and 426 are selected by select signals 312 and 314, respectively, with their results provided, through a pair of registers, to upper bit compare unit 264.

The addition of multiplexers 424 and 426 allows the three lowest bits of sums of lower portions to be compared by lower bit comparison unit 340 during a first clock cycle and the comparisons of the upper two bits of sums of lower portions to be delayed until a next clock cycle, when upper portion calculations are performed. By delaying comparison of a portion of the lower portion sums until a next clock cycle, a better balance in the number of sequential add and the number of sequential compare operations performed during each clock cycle may be achieved. This is true because, in the absence of delay, the number of sequential compare operations required for upper portion calculations is greater than the number of sequential addition operations required for upper portion calculations. By balancing the number of sequential operations required for addition and comparison, a shorter critical path to producing updated path metrics, such as updated path metric upper portion 68A may be achieved. Thus, by further dividing lower portion comparisons into two sub-portions and delaying comparisons associated with one of the sub-portions until a next clock cycle when upper portion calculations are performed, the speed of add-compare-select unit 102, and therefore hard disk drive system 10 may be increased.

The upper two bits of a first updated provisional path metric lower portions for add-compare-select unit 102 is provided as 468B(2), and the lower three bits of the first updated provisional path metric lower portions are provided as 568B(2). A second updated provisional path metric lower portion is similarly provided as 468B(1) and 568B(1). Although the embodiment illustrated in FIG. 7 illustrates a particular sub-division of lower portion calculations, other divisions may be utilized without departing from the scope of the present invention.

Although the present invention and its advantages have been described in detail, it should be understood the various changes, substitutions, and alterations can be made therein without departing from the spirit and scope of the present invention as defined by the appended claims.

What is claimed is:

1. A method for generating an updated path metric, the method comprising the step of:

operating a detector in a single clock cycle including the following substep:

adding each of first and second provisional path metric first portions with an associated branch metric first portion to produce a first provisional updated path metric first portion to produce a first provisional updated path metric first portion candidate and a second provisional updated path metric first portion candidate, respectively;

selecting one of the provisional first portion updated path metric candidates to produce an updated path metric first portion candidate;

combining any carry component of the selected updated path metric first portion candidate with a path metric second portion and a branch metric second portion to produce a first updated path metric second portion candidate;

comparing the updated path metric second portion candidate to at least one other updated path metric second portion candidate; and selecting one of the updated path metric second portion candidates to produce an updated path metric second portion.

2. The method of claim 1, wherein the updated path metric comprises an eight bit number and wherein the updated path metric second portion comprises the three most-significant bits of the updated path metric.

3. The method of claim 1, wherein the updated path metric comprises an eight bit number and wherein the updated path metric first portion comprises the five least-significant bits of the updated path metric.

4. The method of claim 1, wherein the step of comparing further comprises receiving a comparison of the updated path metric first portion candidate with at least one other updated path metric first portion candidate.

5. The method of claim 1, wherein the step of selecting one of the compared provisional first portion updated path metric candidates to produce an updated path metric first portion comprises selecting a provisional first portion updated path metric candidate associated with a received selection signal.

6. The method of claim 1, wherein the step of adding any carry component of the selected updated path metric first portion candidate with a path metric second portion and a branch metric second portion comprises adding a binary zero or a binary one with a path metric second portion and a branch metric second portion.

7. The method of claim 1, wherein the step of selecting one of the updated path metric second portion candidates as the updated path metric second portion comprises selecting one of the updated path metric second portion candidates having a value no greater than the value of any of the updated path metric second portion candidates.

8. A hard disk drive system comprising:
a storage media system; and
a read channel for reading data from the storage media system, the read channel including a detector operable to estimate a plurality of data values written to the storage media based on a plurality of data values written to the storage media based on a plurality of data values read from the storage media, the detector comprising:
a branch metric generator operable to generate a branch metric for a data value read from the storage media with respect to each of a plurality of targets; and
an add-compare-select system comprising a plurality of add-compary-select unites, each add-compare-select unit being operable in one clock cycle to receive a branch metric, a path metric upper portion, and first and second provisional path metric lower portions, and generate an updated path metric upper portion and first and second updated provisional path metric lower portions.

9. The hard disk drive system of claim 8, wherein the add-compare-select unit is further operable to generate a select signal indicating which of the first or second updated provisional path metric lower portions is a correct updated path metric lower portion.

10. The hard disk drive system of claim 8, wherein the add-compare-select unit is further operable to generate the first and second updated provisional path metric lower portions before generating the updated path metric upper portion.

11. The hard disk drive system of claim 9, wherein the add-compare-select unit is further operable to generate the select signal after generating the updated path metric upper portion.

12. The hard disk drive system of claim 8, wherein the first provisional path metric lower portion comprises the five least-significant bits of a path metric.

13. The hard disk drive system of claim 8, wherein the path metric upper portion comprises the three least-significant bits of a path metric.

14. The hard disk drive system of claim 8, wherein the add-compare-select unit further comprises a plurality of adders, a plurality of comparators, and a plurality of selectors.

15. The hard disk drive system of claim 8, wherein the add-compare-select unit is further operable to receive a branch metric upper portion and a branch metric lower portion.

16. A method for determining a current input data value based on a plurality of received data values, the received data values each having a plurality of targets, the method comprising the steps of:
operating a detector in a clock cycle for each target;
generating a branch metric for a received data value corresponding to the received input data value, the branch metric represented by a plurality of binary digits ranging from a least-significant bit to a most-significant bit; and
for each possible current state of a first number of sequential input data values including the received input data value:
providing first and second provisional path metric lower portions and first and second provisional path metric lower portions each respectively comprising at least one lesser significant bit of first and second provisional path metrics associated with transitioning from each of first and second possible states of the first number of data values immediately preceding the received input data value to the current state of the first number of input data values including the received input data value, the first and second provisional path metric upper portions each respectively comprising at least one significant bit of the first and second provisional path metrics associated with transitioning from each of first and second possible states of the first number of data values immediately preceding the received input data value to the current state of the first number of input data values including the received input data value;
adding each of the first and second provisional path metric lower portions with a branch metric lower portion to produce, respectively, an updated first provisional path metric lower portion candidate and an updated second provisional path metric lower portion candidate, the branch metric lower portion comprising lesser significant bits of a branch metric associated with a target associated with transitioning from the first possible state of the first number of data values immediately preceding the received input data value to the current state of the first number of input data values including the received input data value;
receiving a selection signal designating one of the first and second provisional path metric lower portion candidates to produce an updated path metric lower portion candidate;
adding any carry component of the selected updated path metric lower portion candidate with a path metric upper portion and a branch metric upper portion to produce a first updated path metric upper portion candidate;
comparing the updated path metric upper portion candidate to at least one other updated path metric upper portion candidate;
selecting one of the updated path metric upper portion candidates as the updated path metric upper portion; and
providing a decision signal indicating which updated path metric upper portion candidate was selected.

17. The method of claim 16, and further comprising:
performing a plurality of provisional lower portion comparisons;
selecting one of the provisional lower portion comparisons; and
providing the selected lower portion comparison for use in the step of comparing the updated path metric upper portion candidate to at least one other updated path metric upper portion candidate.

18. The method of claim 16, wherein the first number is three.

19. A method for generating an updated path metric, the method comprising:
operating a detector in a single clock cycle;
receiving a path metric divided into an upper portion and a lower portion;
receiving a branch metric having at least a lower portion;

adding the lower portion of the path metric to the lower portion of the branch metric to produce a first sum having first and second portions;

adding, during a first clock cycle, the first portion of the first sum to a second sum;

delaying comparison of the second portion of the first sum; and comparing, during a subsequent clock cycle, the second portion of the first sum to a third sum.

20. The method of claim 19, wherein the first portion of the first sum contains two bits and the second portion of the first sum contains three bits.

* * * * *